United States Patent
Min-Soo et al.

(10) Patent No.: US 6,633,062 B2
(45) Date of Patent: Oct. 14, 2003

(54) SEMICONDUCTOR DEVICE INCORPORATED THEREIN HIGH K CAPACITOR DIELECTRIC AND METHOD FOR THE MANUFACTURE THEREOF

(75) Inventors: Kim Min-Soo, Ichon-shi (KR); Lim Chan, Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 10/269,997

(22) Filed: Oct. 15, 2002

(65) Prior Publication Data

US 2003/0040153 A1 Feb. 27, 2003

Related U.S. Application Data

(62) Division of application No. 09/727,584, filed on Dec. 4, 2000, now Pat. No. 6,486,021.

(30) Foreign Application Priority Data

Dec. 22, 1999 (KR) ........................................ 1999-60534

(51) Int. Cl.[7] ............................................ H01L 27/108
(52) U.S. Cl. .................... 257/310; 257/303; 257/306; 257/308; 257/309; 361/303; 361/305; 361/309
(58) Field of Search ................................ 257/303, 306, 257/308, 309, 310; 361/303, 305, 309

(56) References Cited

U.S. PATENT DOCUMENTS 5,977,582 A * 11/1999 Fleming et al. ............. 257/310
6,143,604 A * 11/2000 Chiang et al. ............... 438/253

* cited by examiner

Primary Examiner—Minh Loan Tran
Assistant Examiner—Tan Tran
(74) Attorney, Agent, or Firm—Finnegan, Henderson, Farabow, Garrett, & Dunner, L.L.P.

(57) ABSTRACT

A semiconductor device for use in a memory cell includes an active matrix an active matrix provided with a semiconductor substrate, a plurality of transistors formed on the semiconductor substrate and conductive plugs electrically connected to the transistors, a number of lower electrodes formed on top of the conductive plugs, $Ta_2O_5$ films formed on the lower electrodes, composite films formed on the $Ta_2O_5$ films and upper electrodes formed on the composite films.

6 Claims, 5 Drawing Sheets

US 6,633,062 B2

SEMICONDUCTOR DEVICE INCORPORATED THEREIN HIGH K CAPACITOR DIELECTRIC AND METHOD FOR THE MANUFACTURE THEREOF

This is a divisional of application Ser. No. 09/727,584, filed Dec. 4, 2000, incorporated herein by reference now U.S. Pat. No. 6,486,021.

FIELD OF THE INVENTION

The present invention relates to a semiconductor device; and, more particularly, to a semiconductor memory device incorporating therein high K dielectric as a capacitor dielectric film.

DESCRIPTION OF THE PRIOR ART

As is well known, a dynamic random access memory (DRAM) with at least one memory cell comprised of a transistor and a capacitor has a higher degree of integration mainly by down-sizing through micronization. However, there is still a demand for downsizing the area of the memory cell.

To meet the demand, there have been proposed several structures for the capacitor, such as a trench type or a stack type capacitor, which are arranged three-dimensionally in a memory device to reduce the cell area available to the capacitor. However, the process of manufacturing three-dimensionally arranged capacitor is a long and tedious one and consequently involves high manufacturing cost. Therefore, there is a strong demand for a new memory device that can reduce the cell area with securing a requisite volume of information without requiring complex manufacturing steps.

In attempt to meet the demand, there have been introduced a high K dielectric, e.g., $Ta_2O_5$ or the like, as a capacitor thin film in place of conventional silicon oxide film and/or silicon nitride film. Since, however, a $Ta_2O_5$ layer is grown with a columnar structure, the grown $Ta_2O_5$ layer acts also as a high leakage current path. Therefore, it is very difficult for applying the $Ta_2O_5$ layer to a capacitor thin film for use in memory device.

Alternatively, a multi-layer dielectric, e.g., $Ta_2O/TiO_2$ or $Ta_2O/Al_2O_3$, has been proposed to use as a capacitor thin film by using a metal organic chemical deposition (MOCVD) to overcome the above-described problem. However, the MOCVD method makes a foreign material reside in the capacitor thin film. This result enforces the capacitor thin film to be performed a high temperature heat-treatment, which, in turn, generates a defect and a high leakage current in the capacitor thin film.

There are still demands for developing a high K dielectric having a low leakage current which is compatible with a semiconductor process.

SUMMARY OF THE INVENTION

It is, therefore, an object of the present invention to provide a semiconductor device incorporating therein a high K dielectric as a capacitor dielectric.

It is another object of the present invention to provide a method for manufacturing a semiconductor device incorporating therein a high K dielectric as a capacitor dielectric.

In accordance with one aspect of the present invention, there is provided a semiconductor device for use in a memory cell, comprising: an active matrix provided with a semiconductor substrate, a plurality of transistors formed on the semiconductor substrate and conductive plugs electrically connected to the transistors; a number of lower electrodes formed on top of the conductive plugs; $Ta_2O_5$ films formed on the lower electrodes; composite films formed on the $Ta_2O_5$ films; and upper electrodes formed on the composite films.

In accordance with another aspect of the present invention, there is provided a method for manufacturing a semiconductor device for use in a memory cell, the method comprising the steps of: a) preparing an active matrix provided with at least one transistor, a plurality of conductive plugs electrically connected to the transistors and an insulating layer formed around the conductive plugs; b) forming a first conductive layer on top of the active matrix; c) patterning the first conductive layer a predetermined configuration, thereby obtaining a number of lower electrodes; d) forming a $Ta_2O_5$ layer on the lower electrodes; e) forming a $Ta_{2x}Al_{2(1-x)}O_y$ composite layer on the $Ta_2O_5$ layer, x and y representing mole %; f) forming a second conductive layer on the $Ta_{2x}Al_{2(1-x)}O_y$ composite layer; and g) patterning the second conductive layer, the $Ta_2O_5$ layer and the $Ta_{2x}Al_{2(1-x)}O_y$ composite layer into a preset configuration, thereby obtaining the semiconductor device.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

Figure 1:
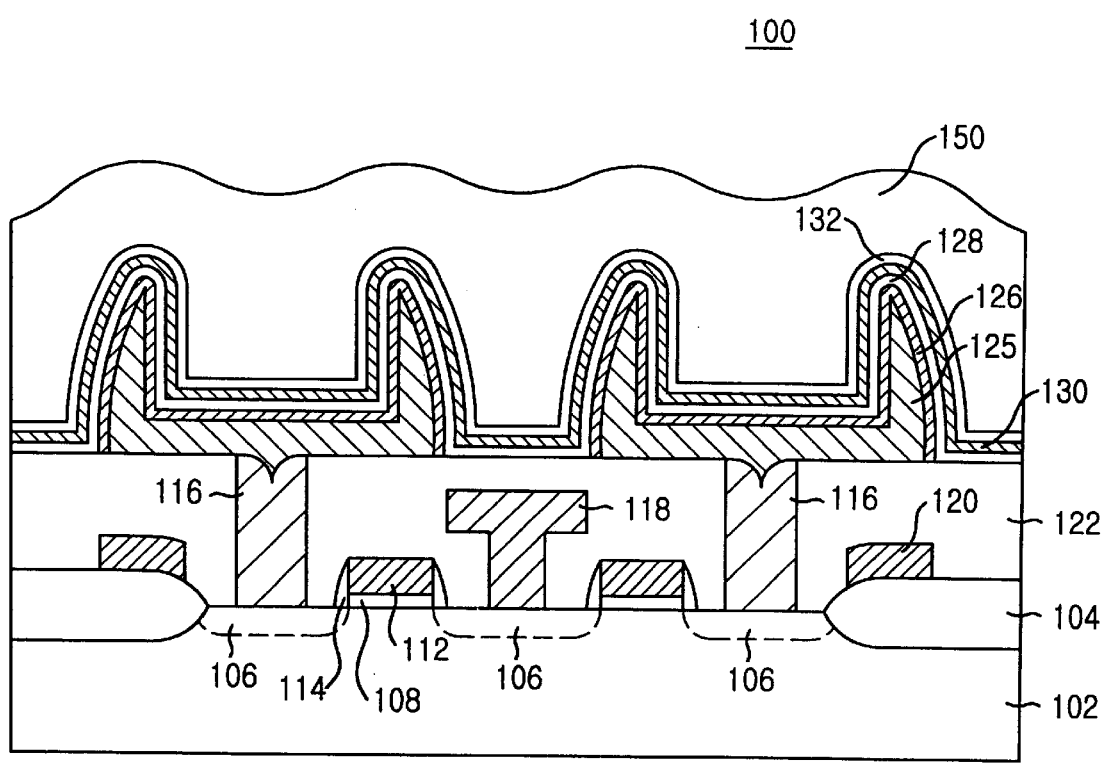
FIG. 1 is a cross sectional view setting forth a semiconductor device in accordance with the present invention.

There are provided in FIGS. 1 and 2A to 2G a cross sectional view of a semiconductor device 100 for use in a memory cell and cross sectional views setting forth a method for the manufacture thereof in accordance with preferred embodiments of the present invention. It should be noted that like parts appearing in FIGS. 1 and 2A to 2G are represented by like reference numerals.

In FIG. 1, there is provided a cross sectional view of the inventive semiconductor device 100 comprising an active matrix and capacitor structures. The active matrix includes a silicon substrate 102, transistors formed on top of the silicon substrate 102, an isolation region 104 for isolating the transistors, poly plugs 116, a bit line 118 and word lines 120. Each of the transistors has diffusion regions 106, a gate oxide 108, a gate line 112 and a sidewall 114.

In the semiconductor device 100, the bit line 118 is electrically connected to one of the diffusion regions 106 to apply an electric potential. Each of the capacitor structures is electrically connected to the other diffusion regions 106 through the poly plugs 116. Although the bit line 118 actually extends in right and left directions bypassing the poly plugs 116, the drawing does not show these parts of the bit line 118. The capacitor structures can be connected to a plate line (not shown) to apply thereto a common constant potential.

Each of the capacitor structures includes lower electrodes 125, diffusion barriers 126 formed on top of the lower electrodes 125, capacitor dielectrics 128, composite films 130 and upper electrodes 132 formed on the composite films 130. The capacitor dielectrics 128 are disposed between the diffusion barriers 126 and the composite films 130. It is preferable that the lower electrodes 125 are made of a poly-Si and the upper electrodes 132 are made of a doped poly-Si with phosphine ($PH_3$) in such a way that its concentration ranges from approximately $1*10^{20}$ to $5*10^{20}$. And also, the composite films 130 are made of $Ta_{2x}Al_{2(1-x)}O_y$ by using an atomic layer deposition (ALD). In the preferred embodiment, the capacitor dielectrics 128 are made of $Ta_2O_5$ and the diffusion barriers 126 are made of $Si_3N_4$ for preventing diffusions between the lower electrodes 125 and the capacitor dielectrics 128.

FIGS. 2A to 2G are schematic cross sectional views setting forth the method for manufacture of a capacitor structure 140 for use in a semiconductor memory device in accordance with the present invention.

Figure 2A:
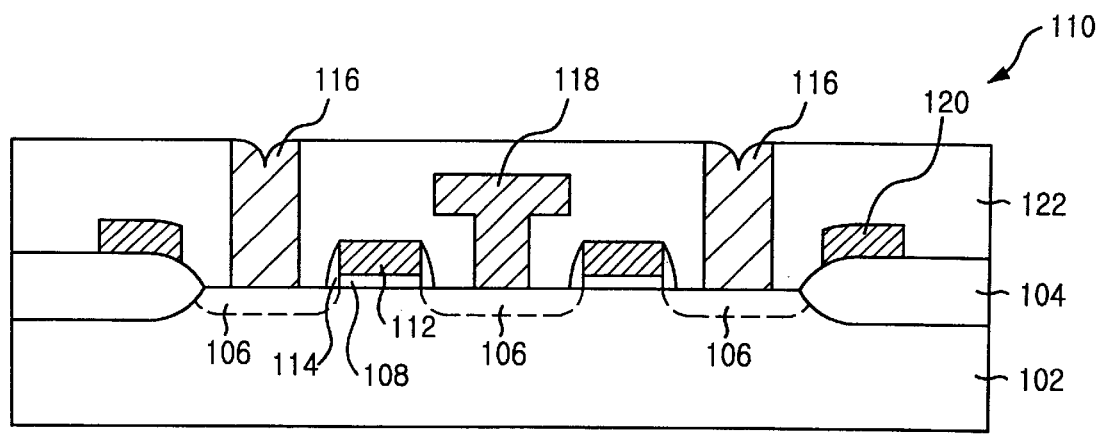
FIGS. 2A to 2G are schematic cross sectional views setting forth a method for the manufacture of the semiconductor memory device in accordance with the present invention.
Figure 2B:
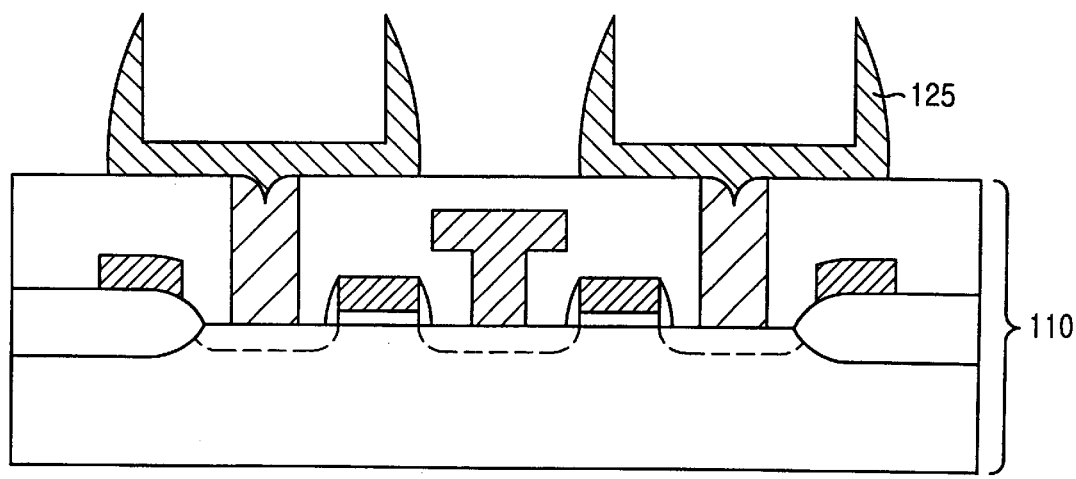

The process for manufacturing the semiconductor device begins with the preparation of an active matrix 110 including a silicon substrate 102, an isolation region 104, diffusion regions 106, gate oxides 108, gate lines 112, a sidewall 114, a bit line 118, poly plugs 116 and an insulating layer 122, as shown in FIG. 2A. The bit line 118 is electrically connected to one of the diffusion regions 106 to apply an electric potential. Each of the poly plugs 116 is electrically connected to the other diffusion regions 106, respectively. Although the bit line 118 actually extends in right and left directions bypassing the poly plugs 116, the drawing does not show these parts of the bit line 118. The capacitor structures 140 can be connected to a plate line (not shown) to apply thereto a common constant potential. The insulating layer 122 is made of a material, e.g., boron-phosphor-silicate glass (BPSG).

In an ensuing step, lower electrodes 125 are formed on top of the active matrix 110 by using a semiconductor process in such a way that each of the lower electrodes 125 is electrically connected to a corresponding poly plug 116, as shown in FIG. 1B. It is preferable that the lower electrodes 125 are made of a poly-Si.

Figure 2C:
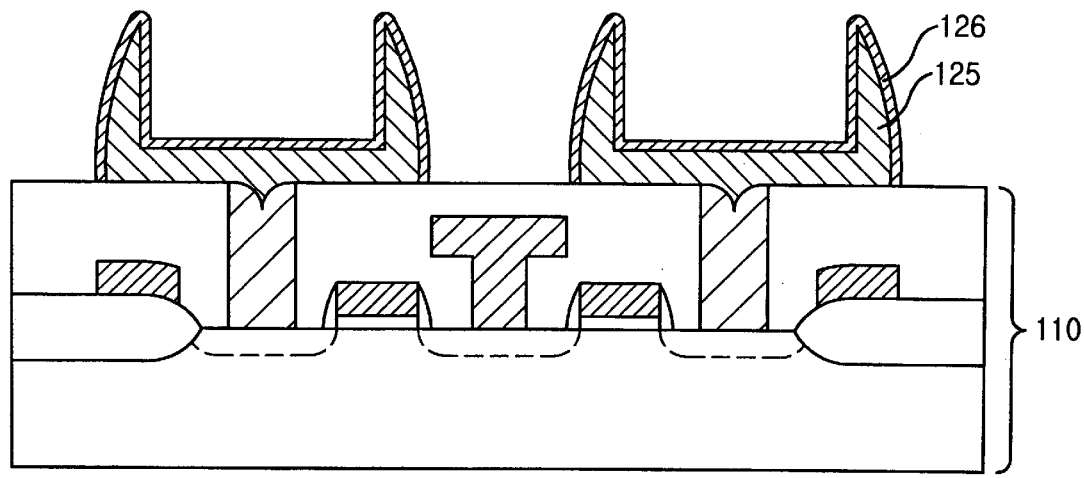

Thereafter, diffusion barriers 126, e.g., made of $Si_3N_4$, are formed on the lower electrodes 125 by using a rapid thermal nitrization (RTN) at a temperature ranging from approximately 750° C. to approximately 900° C. as shown in FIG. 2C.

Figure 2D:
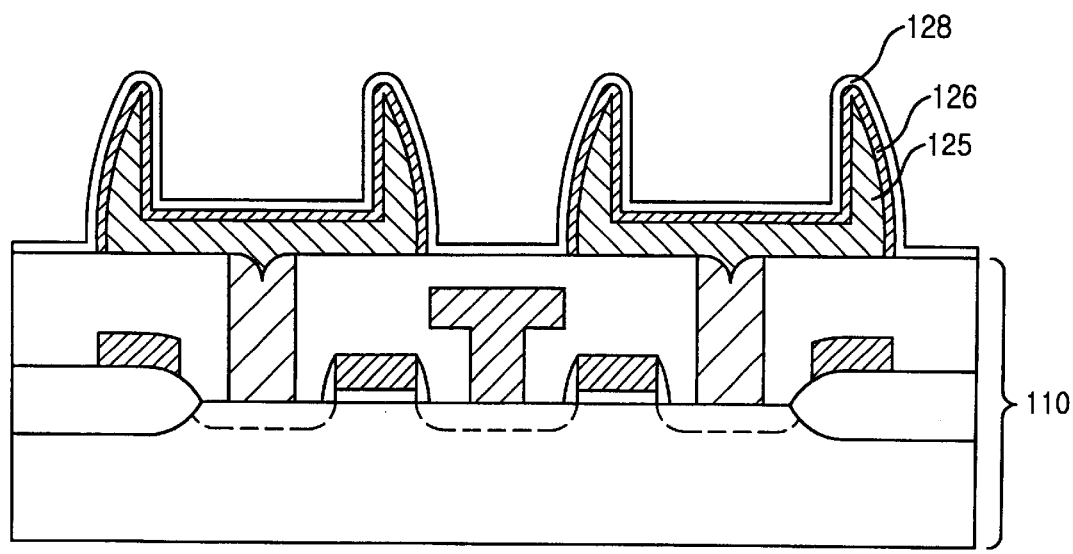

In a following step, a capacitor dielectric layer 128 is formed on the diffusion barriers 126 and portions of the active matrix 110, which are not covered with the diffusion barriers 126, as shown in FIG. 2D. In the preferred embodiment, the capacitor dielectric layer 128 is made of a high K dielectric material such as $Ta_2O_5$ by using an atomic layer deposition (ALD). In this step, the ALD is carried out at a temperature ranging from approximately 200° C. to approximately 400° C. and at a pressure ranging from approximately 50 mTorr to approximately 250 mTorr. Preferably, the capacitor dielectric layer 128 has a thickness ranging from approximately 60 Å to approximately 150 Å. Optionally, the capacitor dielectric layer 128 may be performed a surface treatment at a temperature ranging from approximately 200° C. to approximately 400° C. In the surface treatment, a reaction gas is selected from a group consisting Of $O_2$, $N_2$, $N_2O$ or the like. It is possible that the surface treatment is carried out by using UV ozone at a temperature ranging from approximately 350° C. to approximately 450° C.

Figure 2E:
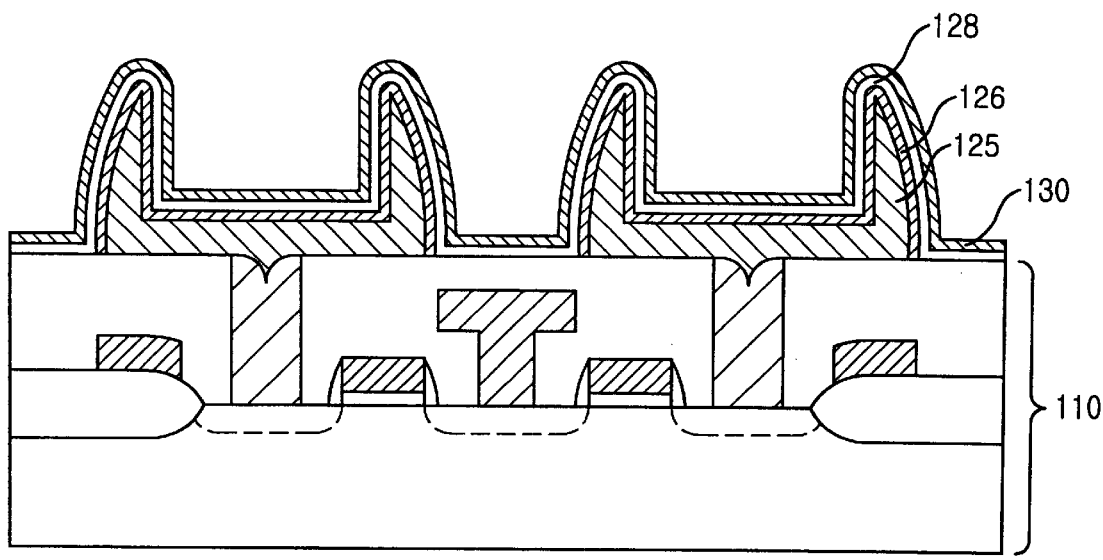

Thereafter, a composite layer 130 is formed on the capacitor dielectric layer 128 by using ADL, as shown in FIG. 2E.

It is preferably that the composite layer 130 is made of $Ta_{2x}Al_{2(1-x)}O_y$, wherein x and y represents mole %. In the preferred embodiment, x is approximately equal to 0–1 and y is approximately equal to 3–5. The composite layer of of $Ta_{2x}Al_{2(1-x)}O_y$ can be formed by as follows:

d1) flowing PET into a reaction chamber as a Ta source with a predefined period of time;

d2) flowing $H_2O$ into the reaction chamber as an oxygen source with a predefined period of time;

d3) flowing TMA into the reaction chamber as an aluminum source with a predefined period of time;

d4) flowing $H_2O$ into the reaction chamber as an oxygen source;

d5) repeating the steps d1) to d4) by a predetermined number of cycles, thereby obtaining the $Ta_{2x}Al_{2(1-x)}O_y$ composite layer 130; and d6) heating the $Ta_{2x}Al_{2(1-x)}O_y$ composite layer 130 at a temperature ranging from approximately 650° C. to approximately 850° C.

In the preferred embodiment, during the step d6) a reactive gas is selected from a group consisting of $O_2$ gas, a $N_2O$ gas, $N_2$ gas or the like. The reaction chamber is maintained at a temperature ranging from approximately 200° C. to approximately 250° C. at a pressure ranging from approximately 50 mTorr to approximately 250 mTorr. Optionally, the $Ta_{2x}Al_{2(1-x)}O_y$ composite layer 130 is densified by heat-treating at a temperature ranging from approximately 650° C. to approximately 850° C. It is preferable that the predefined period of time is between approximately 0.1 seconds and approximately 20 seconds.

It is possible that the step d6) is carried out by using UV ozone at a temperature ranging from approximately 350° C. to approximately 450° C. Alternatively, the step d6) is carried out by using a plasma process at a temperature ranging from approximately 350° C. to approximately 450° C. Preferably, the $Ta_{2x}Al_{2(1-x)}O_y$ composite layer 130 has a thickness ranging from approximately 10 Å to 30 Å. In accordance with preferred embodiment, cycles of step d1) to step d4) are controlled in such a way that x is approximately equal to 0–1 and y is approximately equal to 3–5.

Figure 2F:
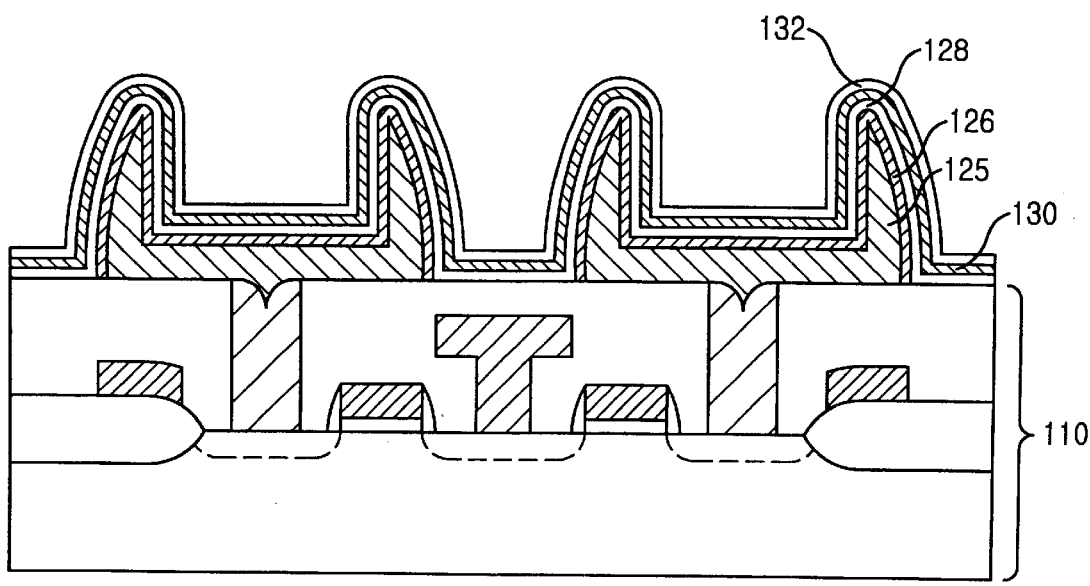

And then, a conductive layer 132 is formed on top of the $Ta_{2x}Al_{2(1-x)}O_y$ composite layer 130 at a temperature ranging from approximately 500° C. to approximately 620° C., as shown in FIG. 2F. The conductive layer 132 has a thickness ranging from approximately 500 Å to approximately 1,500 Å. It is preferable that the conductive layer 132 is a poly-Si doped with $PH_3$ in such a way that its concentration ranges from approximately $1*10^{20}$ to $5*10^{20}$.

In the next step, the conductive layer 132, the $Ta_{2x}Al_{2(1-x)}O_y$ composite layer 130 and the capacitor dielectric layer 128 are patterned into a memory block (not shown).

Figure 2G:
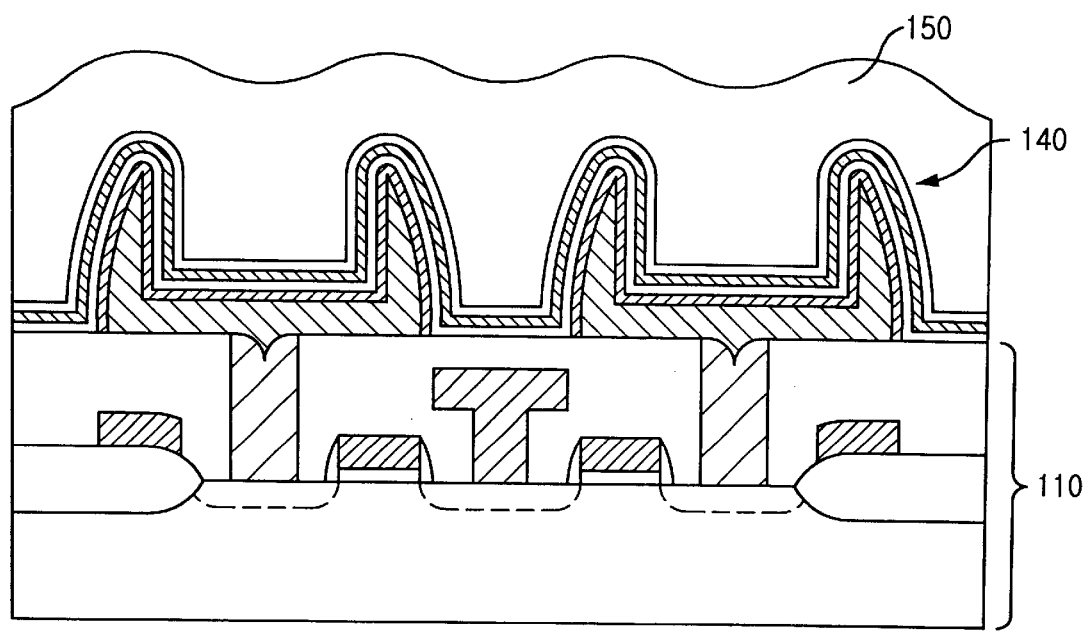

Finally, an insulating layer 150, e.g., made of BPSG, is formed on top of the conductive layer 132 by using a method such as a plasma CVD and made flat by using a method such as chemical mechanical polishing (CMP), as shown in FIG. 2G.

While the present invention has been described with respect to the particular embodiments, it will be apparent to those skilled in the art that various changes and modifications may be made without departing from the scope of the invention as defined in the following claims.

What is claimed is:

1. A semiconductor device for use in a memory cell comprising:
    an active matrix including a semiconductor substrate, a plurality of transistors formed on the semiconductor substrate and conductive plugs electrically connected to the transistors;
    at least one lower electrode formed on top of the conductive plugs;
    at least one $Ta_2O_5$ film formed on the lower electrodes;
    at least one $Si_3N_4$ film formed between the at least one lower electrode and the at least one $Ta_2O_5$ film;
    at least one $Ta_{2x}Al_{2(1-x)}O_y$ composite film formed on the at least one $Ta_2O_5$ film, x and y representing mole %; and
    at least one upper electrode formed on the at least one $Ta_{2x}Al_{2(1-x)}O_y$ composite film.

2. The semiconductor device of claim 1, wherein the at least one lower electrode is made of a poly-Si.

3. The semiconductor device of claim 2, wherein the at least one $Ta_{2x}Al_{2(1-x)}O_y$ composite film is formed by using an atomic layer deposition (ALD), x and y representing mole %.

4. The semiconductor device of claim 3, wherein the at least one upper electrode is made of a doped poly-Si with phosphine ($PH_3$) in such a way that its concentration ranges from approximately $1 \times 10^{20}$ atoms/cm$^3$ to approximately $5 \times 10^{20}$ atoms/cm$^3$.

5. The semiconductor device of claim 3, wherein the at least one $Ta_{2x}Al_{2(1-x)}O_y$ composite film is formed at a thickness ranging from approximately 10 Å to approximately 30 Å.

6. The semiconductor device of claim 3, wherein, in the at least one $Ta_{2x}Al_{2(1-x)}O_y$ composite film, x is approximately equal to 3–5.

* * * * *